US010393798B2

(12) United States Patent
Andry et al.

(10) Patent No.: US 10,393,798 B2
(45) Date of Patent: Aug. 27, 2019

(54) INTEGRATED ELECTRO-OPTICAL MODULE ASSEMBLY

(71) Applicant: International Business Machines Corporation, Armonk, NY (US)

(72) Inventors: Paul S. Andry, Yorktown Heights, NY (US); Qianwen Chen, Ossining, NY (US); Bing Dang, Chappaqua, NY (US); John U. Knickerbocker, Yorktown Heights, NY (US); Minhua Lu, Mohegan Lake, NY (US); Robert J. Polastre, Cold Spring, NY (US); Bucknell C. Webb, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/821,403

(22) Filed: Nov. 22, 2017

(65) Prior Publication Data

US 2018/0095125 A1    Apr. 5, 2018

Related U.S. Application Data

(63) Continuation-in-part of application No. 15/452,933, filed on Mar. 8, 2017.
(Continued)

(51) Int. Cl.
*G01R 31/309* (2006.01)
*G01R 31/28* (2006.01)
(Continued)

(52) U.S. Cl.
CPC ....... *G01R 31/2818* (2013.01); *G01R 31/309* (2013.01); *H05K 1/0268* (2013.01);
(Continued)

(58) Field of Classification Search
CPC .. G01R 31/2818; G01R 31/44; G01R 31/309; H05K 1/0268; H05K 3/305; H05K 1/111;
(Continued)

(56) References Cited

U.S. PATENT DOCUMENTS

| 8,721,074 B2 | 5/2014 | Pugh et al. | |
|---|---|---|---|
| 2002/0113598 A1* | 8/2002 | Tsuji | G01R 31/2805 324/501 |

(Continued)

OTHER PUBLICATIONS

List of IBM Patents or Patent Applications Treated as Related dated Nov. 22, 2017, 2 pages.
(Continued)

*Primary Examiner* — Akm Zakaria
(74) *Attorney, Agent, or Firm* — Scully, Scott, Murphy & Presser, P.C.; JoAnn Kealy Crockatt

(57) ABSTRACT

An electro-optical module assembly is provided that includes a flexible substrate having a first surface and a second surface opposite the first surface, wherein the flexible substrate contains an opening located therein that extends from the first surface to the second surface. An optical component is located on the second surface of the flexible substrate and is positioned to have a surface exposed by the opening. At least one electronic component is located on a first portion of the first surface of the flexible substrate, and at least one micro-energy source is located on a second portion of the first surface of the flexible substrate.

15 Claims, 10 Drawing Sheets

Related U.S. Application Data

(60) Provisional application No. 62/333,525, filed on May 9, 2016.

(51) Int. Cl.
| | | |
|---|---|---|
| *H05K 3/34* | (2006.01) | |
| *H05K 3/30* | (2006.01) | |
| *H05K 3/00* | (2006.01) | |
| *H05K 1/18* | (2006.01) | |
| *H05K 1/11* | (2006.01) | |
| *H05K 1/03* | (2006.01) | |
| *H05K 1/02* | (2006.01) | |
| *H05K 13/00* | (2006.01) | |

(52) U.S. Cl.
CPC ......... *H05K 1/0274* (2013.01); *H05K 1/0393* (2013.01); *H05K 1/111* (2013.01); *H05K 1/189* (2013.01); *H05K 3/0026* (2013.01); *H05K 3/305* (2013.01); *H05K 3/341* (2013.01); *H05K 3/3494* (2013.01); *H05K 13/0069* (2013.01); *H05K 2201/09072* (2013.01); *H05K 2201/1006* (2013.01); *H05K 2201/10015* (2013.01); *H05K 2201/10037* (2013.01); *H05K 2201/10098* (2013.01); *H05K 2201/10106* (2013.01); *H05K 2201/10121* (2013.01); *H05K 2201/10522* (2013.01); *H05K 2203/107* (2013.01); *H05K 2203/162* (2013.01)

(58) Field of Classification Search
CPC .. H05K 1/0393; H05K 1/0274; H05K 3/3494; H05K 3/341; H05K 3/0026; H05K 1/189; H05K 2201/09072; H05K 2201/10522; H05K 2201/10106; H05K 13/0069; H05K 2201/10015
See application file for complete search history.

(56) References Cited

U.S. PATENT DOCUMENTS

| | | |
|---|---|---|
| 2006/0028926 A1 | 2/2006 | Terada et al. |
| 2007/0057684 A1* | 3/2007 | Chong ............... G01R 1/07342 324/754.07 |
| 2010/0237892 A1 | 9/2010 | Ueno |
| 2011/0034912 A1* | 2/2011 | de Graff ........... H01L 27/14687 606/21 |
| 2013/0041235 A1* | 2/2013 | Rogers ................ A61B 5/6867 600/306 |
| 2013/0320376 A1* | 12/2013 | Hasin .................. H01L 31/0543 257/98 |
| 2017/0082485 A1 | 3/2017 | Chiang et al. |

OTHER PUBLICATIONS

Office Action dated May 17, 2018 received in the parent U.S. Patent Application, namely U.S. Appl. No. 15/452,933.
Office Action dated May 9, 2019 received in the parent U.S. Patent Application, namely U.S. Appl. No. 15/452,933, copy not enclosed.

* cited by examiner

INTEGRATED ELECTRO-OPTICAL MODULE ASSEMBLY

BACKGROUND

The present application relates to structures containing electronic components, energy sources and optical components integrated on a flexible substrate. More particularly, the present application relates to an integrated electronic optical (i.e., electro-optical) module assembly, and a method for forming the same.

Electro-optical module integration is critical for many applications such as, for example, miniaturized cameras (i.e., cell phone cameras), digital microscopes, electronic eyeglasses, and electronic contact lens. These electro-optical modules usually require assembly of various complex components such as, for example, semiconductor die, photodiode/LED, micro-energy source, and optical lens. Electronic components, micro-energy sources, and optical lens usually have different form factors and processing requirements. Therefore, it is difficult to implement a batch process for high volume production of the electro-optical modules. There is thus a need for providing a method that can efficiently fabricate integrated electro-optical module assemblies in a high volume.

SUMMARY

In one aspect of the present application, an electro-optical module assembly is provided. In one embodiment, the electro-optical module assembly includes a flexible substrate having a first surface and a second surface opposite the first surface, wherein the flexible substrate contains an opening located therein that extends from the first surface to the second surface. An optical component is located on the second surface of the flexible substrate and is positioned to have a surface exposed by the opening. At least one electronic component is located on a first portion of the first surface of the flexible substrate, and at least one micro-energy source is located on a second portion of the first surface of the flexible substrate.

In another aspect of the present application, a test structure for use in electro-optical module assembly is provided. In one embodiment, the test structure includes a frame containing a plurality of openings and having a plurality of integrated probes located on a surface thereof. The test structure further includes a flexible substrate comprising areas for forming electro-optical module assemblies, the flexible substrate containing integrated traces and pads for electrical testing located on a surface thereof. The integrated probes of the frame and the integrated traces and pads of the flexible substrate are configured to contact each other upon contacting the frame with the flexible substrate. In accordance with the present application, each opening in the frame is configured to expose one of the areas for forming one of the electro-optical module assemblies. The test structure even further includes a light source located beneath the flexible substrate.

In a further aspect of the present application, methods of forming a plurality of electro-optical module assemblies are provided. In one embodiment, the method includes providing a flexible substrate containing a first surface and a second surface opposite the first surface, the first surface including a plurality of electronic components located thereon. Next, a frame containing openings therein is brought into contact with the first surface of the flexible substrate, wherein each opening of the frame physically exposes at least one of the electric components and an electro-optical module assembly area of the flexible substrate. An opening is then formed in an inner portion of each electro-optical module assembly area of the flexible substrate utilizing the frame as a mask. Next, an optical component is affixed to the second surface of the flexible substrate and within each electro-optical module assembly area of the flexible substrate, wherein each opening in the electro-optical module assembly area of the flexible substrate exposes a portion of one of the optical components. Outermost portions of each electro-optical module assembly area of the flexible substrate exposed by each opening in the frame are then cut to provide a plurality of pre-electro-optical module assemblies having the first and second surfaces. Next, at least one micro-energy source is provided to the first surface of each pre-electro-optical module assembly.

In another embodiment, the method includes providing a flexible substrate containing a first surface and a second surface opposite the first surface, the first surface including a plurality of electronic components located thereon. Next, a frame containing openings therein is brought into contact with the first surface of the flexible substrate, wherein each opening of the frame physically exposes at least one of the electric components and an electro-optical module assembly area of the flexible substrate. An opening is then formed in the inner portion of each electro-optical module assembly area of the flexible substrate utilizing the frame as a mask. Next, an optical component is affixed to the second surface of the flexible substrate and within each electro-optical module assembly area of the flexible substrate, wherein each opening in the electro-optical module assembly area of the flexible substrate exposes a portion of one of the optical components. At least one micro-energy source is then formed within the electro-optical module assembly area and on the first surface of the flexible substrate, and thereafter outermost exposed portions of each electro-optical module assembly area of the flexible substrate exposed by each opening in the frame are cut to provide the electro-optical module assemblies.

DETAILED DESCRIPTION

Figure 1:
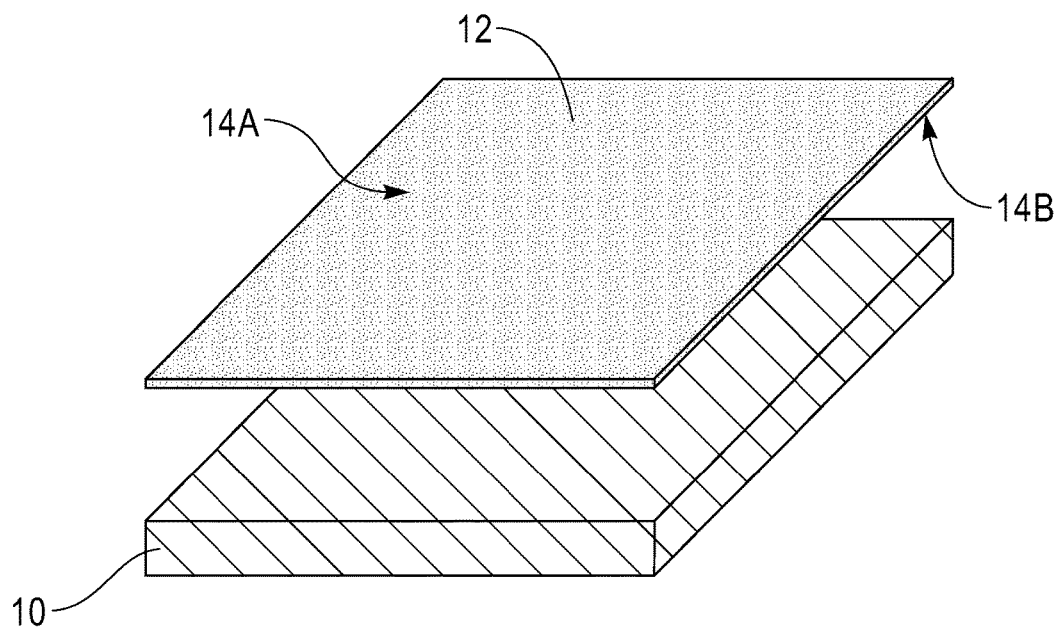
FIG. 1 is a pictorial representation illustrating the positioning of a flexible substrate over a physically exposed surface of a vacuum chuck.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is represented an initial stage of the method of present application in which a flexible substrate 12 is positioned over a physically exposed surface of a vacuum chuck 10. The positioning may be performed by hand or by utilizing a mechanical device such as, for example, a robot arm. The flexible substrate 12 may, or may not, have the same dimension and/or shape as the physically exposed surface of the vacuum chuck 10.

The vacuum chuck 10 that is employed in the present application can be rotated in a clock-wise direction, a counter clock-wise direction or both a clock-wise direction and a counter clock-wise direction. The vacuum chuck 10 includes a surface that contains a plurality of through holes located therein in which a vacuum can be subsequently applied thereto to hold a work-piece onto the surface of the vacuum chuck 10. In the present application, the work-piece is a flexible substrate 12. The flexible substrate 12 that can be used in the present application may be composed of a flexible plastic material such as, for example, a polyimide, a polyether ketone (PEEK) or a transparent conductive polyester. The flexible substrate 12 that can be employed in the present application can conform to any desired shape or it can flex during its use. Thus, the flexible substrate 12 that is employed in the present application is not flat or planar; however upon subsequent placement onto the vacuum chuck 10, the flexible substrate 10 is flat. The flexible substrate 12 has a first surface 14A and a second surface 14B that is opposite the first surface 14B. In the illustrated embodiment of the present application, the second surface 14B of the flexible substrate 12 is to be placed on, and held directly to, the surface of the vacuum chuck 10 that contains the plurality of through holes. The first surface 14A of the flexible substrate 12 that is opposite the second surface 14B of the flexible substrate 12 will be physically exposed and can be subjected to further processing.

Figure 2:
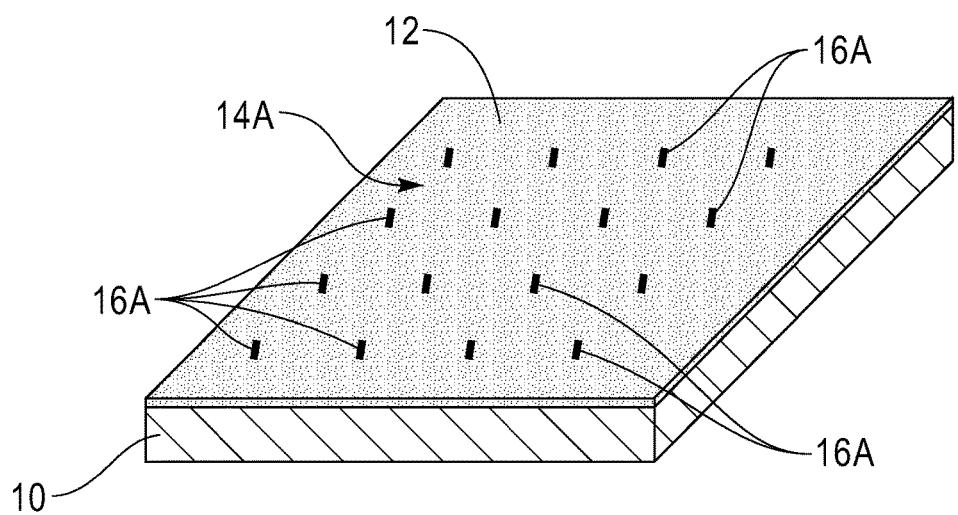
FIG. 2 is a pictorial representation of the exemplary structure of FIG. 1 after bringing the flexible substrate in direct contact with the physically exposed surface of the vacuum chunk and forming a first set of first electronic components on portions of a physically exposed surface of the flexible substrate, wherein each first electronic component of the first set is orientated in a first direction.

Referring now to FIG. 2, there is illustrated the exemplary structure of FIG. 1 after bringing the flexible substrate 12 in direct contact with the physically exposed surface of the vacuum chunk 10 and forming a first set of first electronic components 16A on portions of a physically exposed surface, i.e., the first surface 14A, of the flexible substrate 12. As is shown, each first electronic component 16A of the first set is orientated in a first direction. The term "electronic component" is used throughout the present application to denote any device that can transmit and/or receive an electronic signal.

The flexible substrate 12 is brought in direct contact with the physically exposed surface of the vacuum chunk 10 by applying a vacuum to the through holes located in the surface of the vacuum chuck 10 that is of sufficient force/ strength to bring the positioned flexible substrate 12 in direct physical contact with the vacuum chuck 10. The vacuum chuck 10 may be rotated after direct physical contact between the flexible substrate 12 and the vacuum chuck 10 is made. The vacuum is maintained during the forming of the first set of first electronic components 16A. Each first electronic component 16A can be formed onto the first surface 14A of the flexible substrate 12 by first selecting an area on the first surface 14A of the flexible substrate 12 for forming each first electronic component 16A and thereafter attaching each first electronic component 16A to the selected areas of the flexible substrate 12; the selecting and attaching may be referred to as a pick and place method. In one embodiment, the attaching may be performed utilizing a solder bump that can be formed on a physically exposed surface of each first electronic component 16A and/or selected portions of the first surface of the flexible substrate 12. After attaching, a solder reflow is performed to form a permanent solder joint between the first surface 14A of the flexible substrate 12 and each first electronic component 16A.

In one embodiment, each first electronic component 16A of the first set includes a semiconductor die. As known to those skilled in the art, a semiconductor die (i.e., semiconductor chip) includes a semiconductor substrate having one or more semiconductor devices located thereon and/or thereupon, and one or more interconnect levels including wiring structures embedded within an interconnect dielectric material. The semiconductor die that may be used as each first electronic component 16A may be formed utilizing techniques that are well known to those skilled in the art.

In another embodiment of the present application, each first set of first electronic components 16A includes a RF antenna. As known to those skilled in the art, a RF antenna includes a metal trace coil. The RF antenna that may be used as each first electronic component 16A may be formed utilizing techniques that are well known to those skilled in the art.

Figure 3:
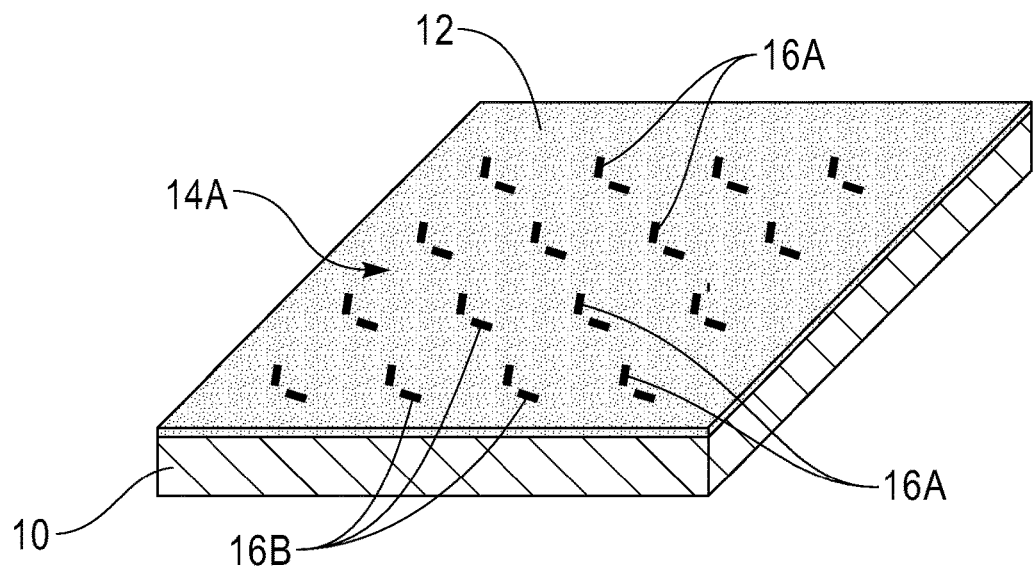
FIG. 3 is a pictorial representation of the exemplary structure of FIG. 2 after forming a second set of second electronic components on other portions of the physically exposed surface of the flexible substrate, and each second electronic component of the second set is orientated in a second direction which is different from the first direction.

Referring now to FIG. 3, there is illustrated the exemplary structure of FIG. 2 after forming a second set of second electronic components 16B on other portions of the physically exposed surface (i.e., the first surface 14A) of the flexible substrate 12, wherein each second electronic component 14B of the second set is orientated in a second direction which is different from the first direction. In some embodiments, this step of the present application may be omitted. The forming of the second electronic components 16B can be performed by first rotating the vacuum chuck 10. The rotation may be in a clock-wise direction or a counter clock-wise direction. The rotation is performed while maintaining the vacuum so as to hold the flexible substrate 10 on the vacuum chuck 10. After rotating the vacuum chuck, the second set of second electronic components 16B are attached to selected areas of the flexible substrate 12; i.e., a second pick and place method is used. In one embodiment, the attaching may be performed utilizing a solder bump that can be formed on a physically exposed surface of each second electronic component 16B and/or selected portions of the first surface of the flexible substrate 12. After attaching, a solder reflow is performed to form a permanent solder joint between the first surface 14A of the flexible substrate 12 and each second electronic component 16B.

Each second electronic component 16B may include one of the electronic components mentioned above for the first set of first electronic components 16A. In one embodiment, each second electronic component 16B includes a same electronic component as each first electronic component 16A. For example, each first electronic component 16A may be a first semiconductor die, while each second electronic component 16B may be a second semiconductor die. In another embodiment, each second electronic component 16B includes a different electronic component than each first electronic component 16A. For example, each first electronic component 16A may be a semiconductor die, while each second electronic component 16B may be an RF antenna.

Notwithstanding the types of first and second electronic components (16A, 16B) employed, the first and second electronic components (16A, 16B) are configured such that each first electronic component 16A is associated with, and in proximity to, one of the second electronic components 16B.

Figure 4:
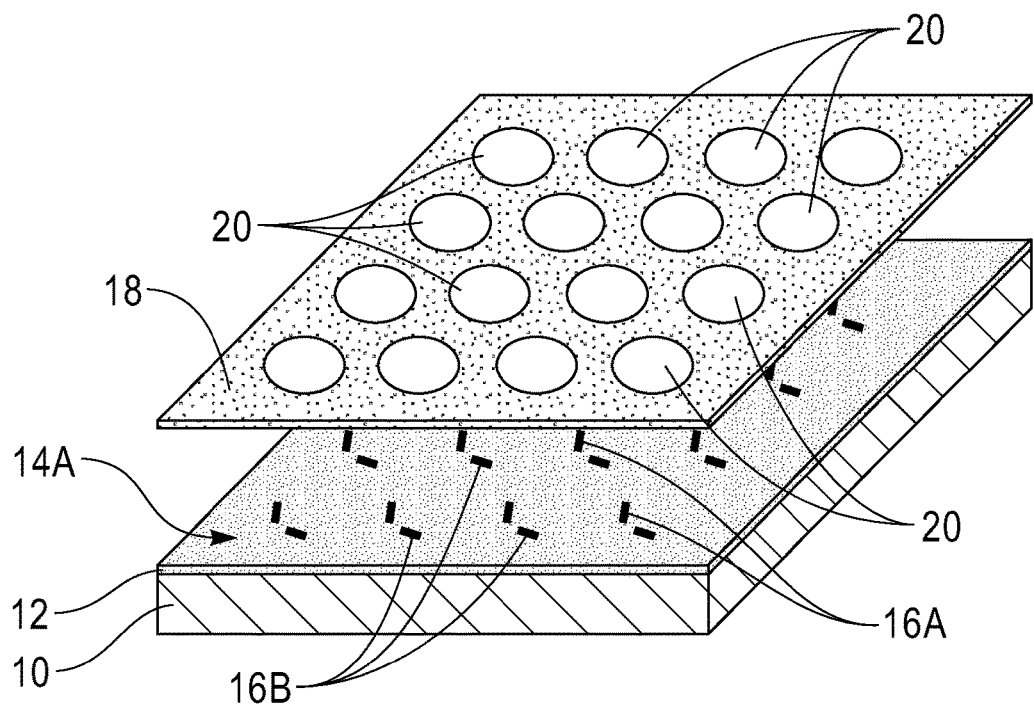
FIG. 4 is a pictorial representation of the exemplary structure of FIG. 3 after positioning a frame over the physically exposed surface of the flexible substrate, wherein the frame contains a plurality of openings, which each opening is configured to expose a neighboring pair of a first electronic component of the first set and a second electronic component of the second set.

Referring now to FIG. 4, there is illustrated the exemplary structure of FIG. 3 after positioning a frame 18 over the physically exposed surface (i.e., first surface 14A) of the flexible substrate 12, wherein the frame 18 contains a plurality of openings 20. Each opening 20 is configured to expose a neighboring pair of a first electronic component 16A of the first set and a second electronic component 16B of the second set. The positioning may be performed by hand or by utilizing a mechanical device such as, for example, a robot arm. The frame 18 may, or may not, have the same dimension and/or shape as the flexible substrate 12.

The frame 18 may be composed of various materials including, for example, a metal. The openings 20 that are present in the frame 18 may be formed utilizing techniques well known to those skilled in the art including, but not limited to, lithography and etching, laser cutting, and sawing. Each opening 20 within the frame 18 has a same shape. In one embodiment, and as shown in FIG. 4, each opening 20 of the frame 18 is circular. Other shapes such as, for example, rectangular, are contemplated and can be used as the shape of each opening 20 of frame 18.

Each opening 20 of the frame 18 is configured to define an electro-optical module assembly area of the flexible substrate 12. By "an electro-optical module assembly area", it is meant an area of the flexible substrate 12 in which an electro-optical module assembly will be subsequently formed. In embodiments in which each opening 20 is circular, each opening 20 may have a diameter of from 1 mm to 15 mm. The diameter/perimeter of each opening 20 will be used to define the outer diameter/perimeter of each electro-optical module assembly to be subsequently formed.

The frame 18 may contain various securing elements/ components for attaching frame 18 to the physically exposed surface (i.e., the first surface 14A) of the flexible substrate 12. For example, the frame 18 may contain hinge elements or tape segments.

Figure 5:
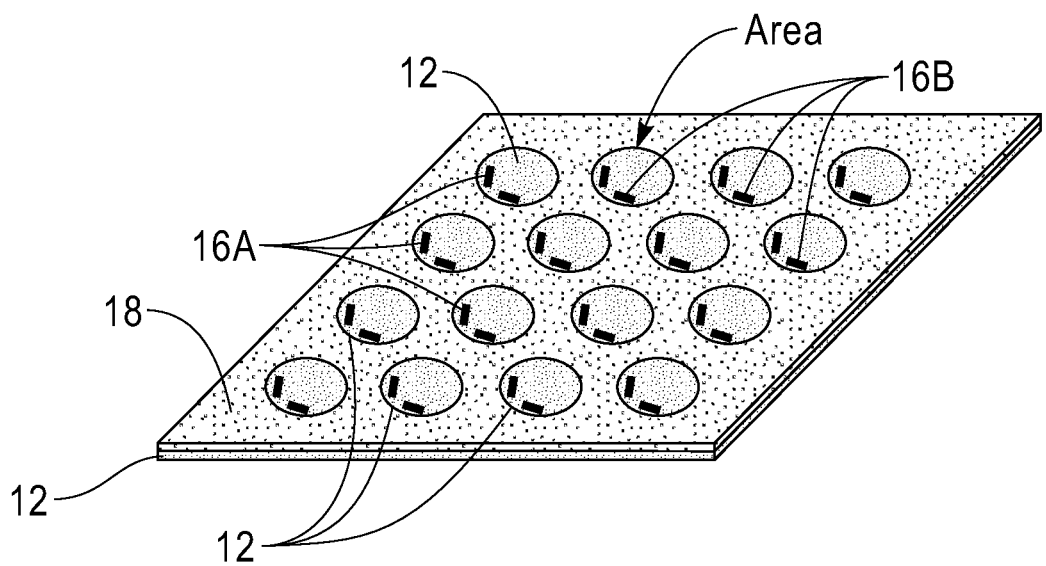
FIG. 5 is a pictorial representation of the exemplary structure of FIG. 4 after bringing the frame in direct contact with the physically exposed surface of the flexible substrate, and removing the resultant structure from the vacuum chuck.

Referring now to FIG. 5, there is illustrated the exemplary structure of FIG. 4 after bringing the frame 18 in direct contact with the physically exposed surface (i.e., first surface 14A) of the flexible substrate 12, and removing the resultant structure from the vacuum chuck 10. The bringing of the two structures together can be performed by hand or by utilizing a mechanical device such as, for example, a robot arm. After contacting the two structures together, the frame 18 can be secured to the physically exposed surface (i.e., first surface 14A) of the flexible substrate 12 utilizing the securing elements/components present on the frame 18. At this point, the vacuum may be stopped and thereafter the framed structure (12/18) is then removed from the vacuum chuck. The removal may be performed by hand or by utilizing a mechanical device such as, for example, a robot arm. After placing, each opening 20 exposes an electro-optical module assembly area (denoted as "Area" in FIG. 5) of the flexible substrate 12.

Figure 6:
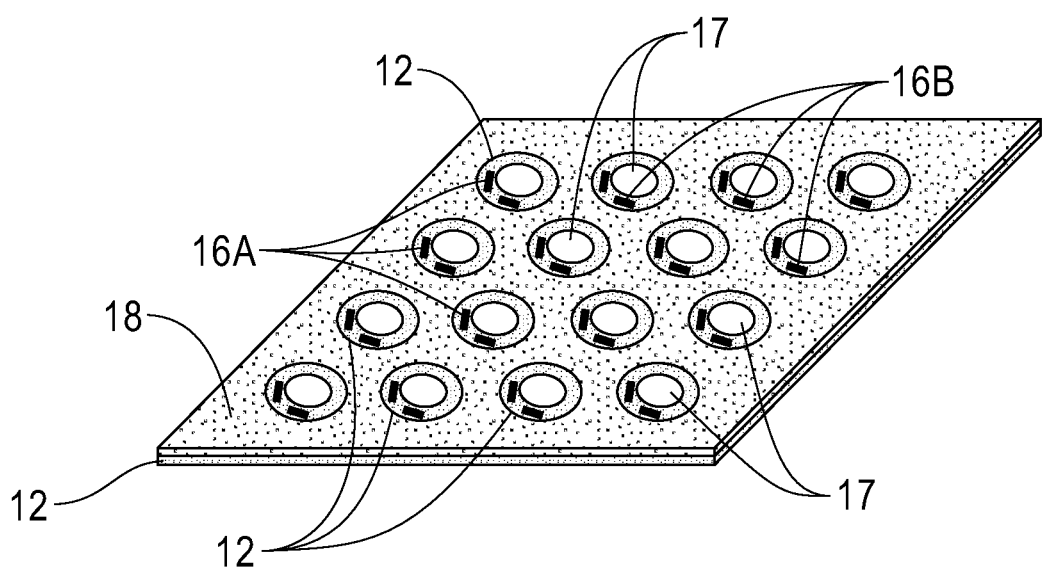
FIG. 6 is a pictorial representation of the exemplary structure of FIG. 5 after performing a first laser cut to provide openings in the flexible substrate, each opening is surrounded by a remaining portion of the flexible substrate.

Referring now to FIG. 6, there is illustrated the exemplary structure of FIG. 5 (i.e., the framed structure 12/18) after performing a first laser cut to provide openings 17 in the flexible substrate 12. Each opening 17 is located in an inner portion of one of the electro-optical module assembly areas and is surrounded by a remaining portion of the flexible substrate 12. Each opening 17 may have any shape and size provided that it remains in one of the electro-optical module assembly areas of the flexible substrate 12 and that a portion of the flexible substrate 12 surrounds the opening 17. In one embodiment, each opening 17 is circular and is used to provide an inner diameter of the electro-optical module assembly to be subsequently formed. In one embodiment, the inner diameter of the electro-optical module assembly to be subsequently formed that is provided by each opening 17 is from 1 mm to 15 mm. Each opening 17 provides a window for a subsequently formed optical component. Laser cutting may be performed utilizing any laser cutting apparatus that is well known to those skilled in the art.

Figure 7:
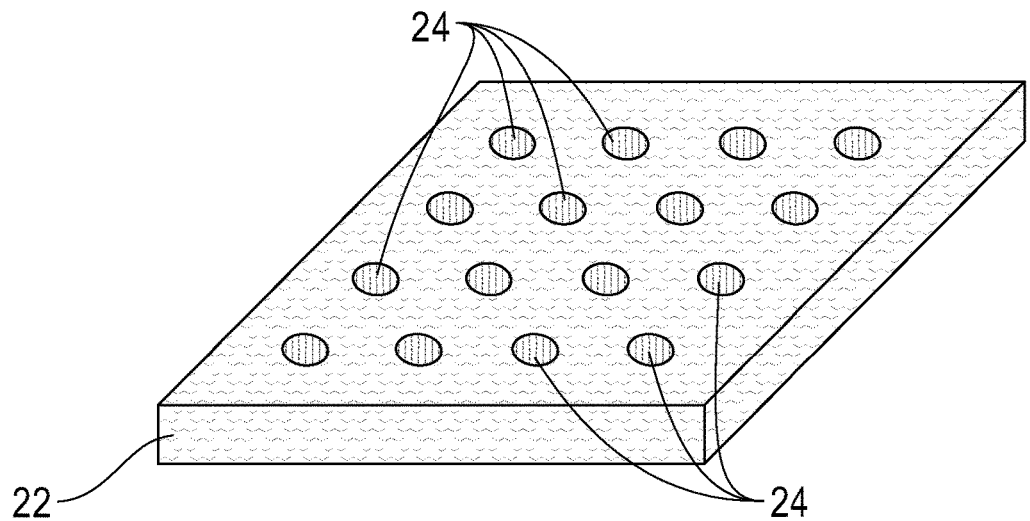
FIG. 7 is a pictorial representation of an optical component holder containing optical components that can be employed in the present application.

Referring now to FIG. 7, there is illustrated an optical component holder 22 containing optical components 24 that can be employed in the present application. The optical component holder 22 may be composed of any material such as, for example, a plastic or a metal. In one embodiment, the optical component holder 22 may be configured to contain openings partially formed therein for holding each optical component 24. In another embodiment, the optical component holder 22 may be configured to include a plurality of vacuum holes for holding edges of each optical component 24 to a surface of the optical component holder 22. The optical component holder 22 may contain various securing elements/components for attaching the optical component holder 22 to second surface 14B of the framed structure frame (12/18). For example, the optical component holder 22 may contain hinge elements or tape segments.

The term "optical component" is used throughout the present application to denote an element that changes the behavior of, bend, or conduct light. Optical components 24 that can be employed in the present application include, for example, a mirror; a lens including a camera lens, or a contact lens, a prism, an optical filter, or a light emitting diode.

The optical components 24 can be formed utilizing techniques well known in the art. In some embodiments, the optical components 24 may be formed in the optical component holder 22 itself. After providing the optical components 24 to the optical component holder 22, an adhesive (conductive or non-conductive) may be applied around the perimeter, i.e., rim, of a physically exposed surface of each optical component 24.

Figure 8:
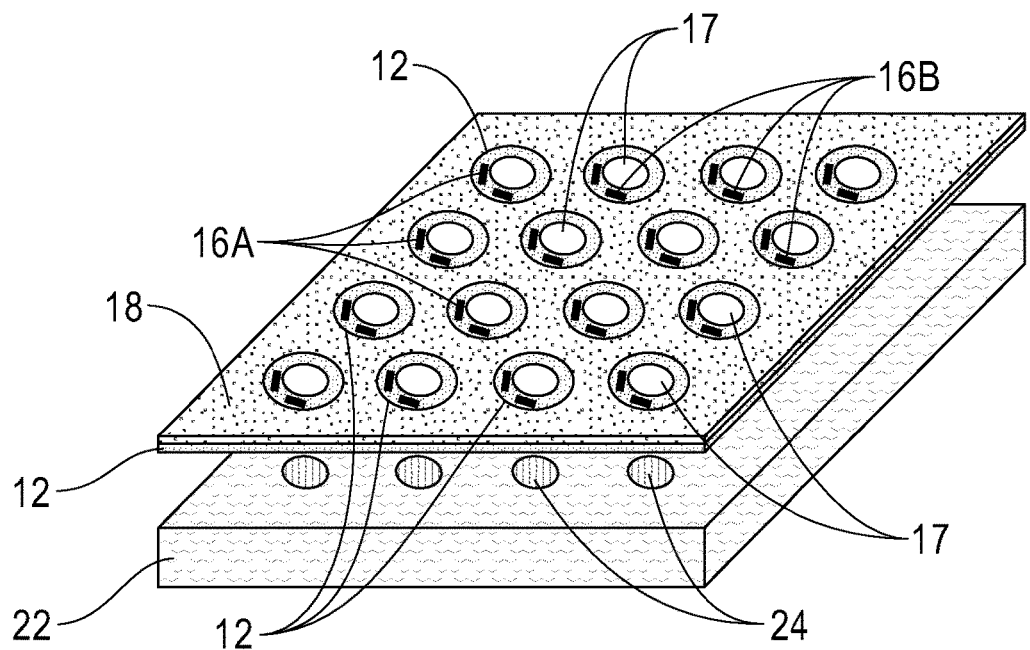
FIG. 8 is a pictorial representation of the exemplary structure of FIG. 7 after positioning the exemplary structure of FIG. 5 over the optical component holder.

Referring now to FIG. 8, there is illustrated the exemplary structure of FIG. 7 after positioning the exemplary structure of FIG. 5 (i.e., the framed structure 12/18) over the optical component holder 22. The positioning may be performed by hand or by utilizing a mechanical device such as, for example, a robot arm. The optical component holder 22 may, or may not, have the same dimension and/or shape as the framed structure (12/18) of FIG. 5. The positioning is such that each optical component 24 of the optical holder component 22 will be subsequently positioned within one of the electro-optical module assembly areas and that a portion of each optical component 24 can be visible through opening 17 that was previously formed in each electro-optical module assembly area. Also, the positioning is such that the second surface 14B of the flexible substrate 12 will face the surface of the optical component holder 22 containing the optical components 24.

Figure 9:
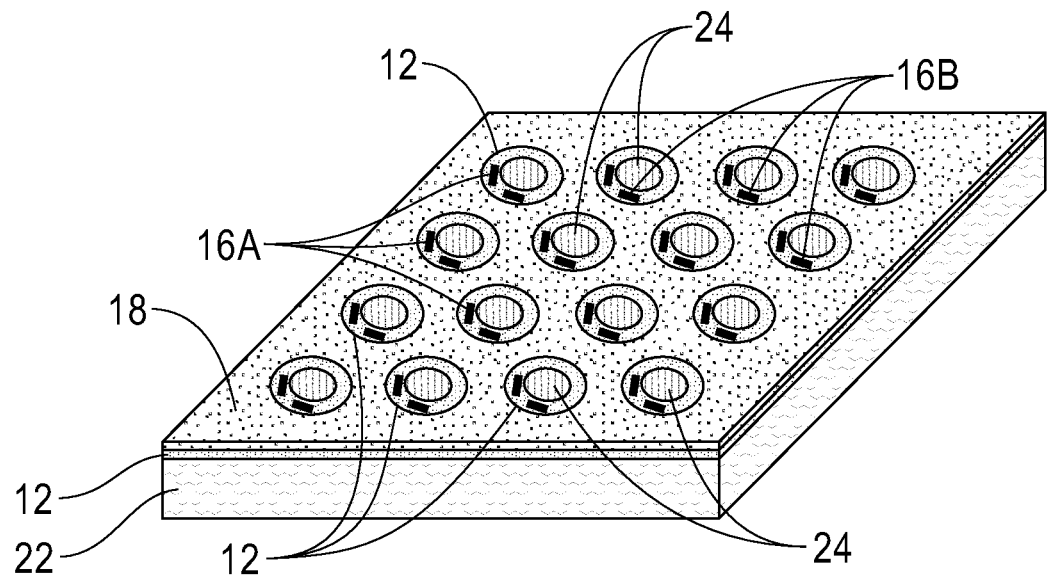
FIG. 9 is a pictorial representation of the exemplary structure of FIG. 8 after placing the structures in contact with each other.

Referring now to FIG. 9, there is illustrated the exemplary structure of FIG. 8 after bringing the structures shown in FIG. 6 in contact with each other. The bringing of the two structures in contact with each other can be performed by hand or by utilizing a mechanical placing device such as, for example, a robot arm. At this point of the present application, the second surface 14B of the flexible substrate 12 is now in direct physical contact with the surface of the optical component holder 22 containing the optical components 24. A cure step may now be performed to transfer each of the optical components 24 to one of the electro-optical module assembly areas. The curing step provides a permanent bond between the adhesive applied to each optical component 24 to the second surface 14B of the flexible substrate 12. In embodiments in which the optical components 24 were held to the surface of the optical holder component 22 by vacuum, the vacuum may or may not be maintained during the curing step.

Figure 10:
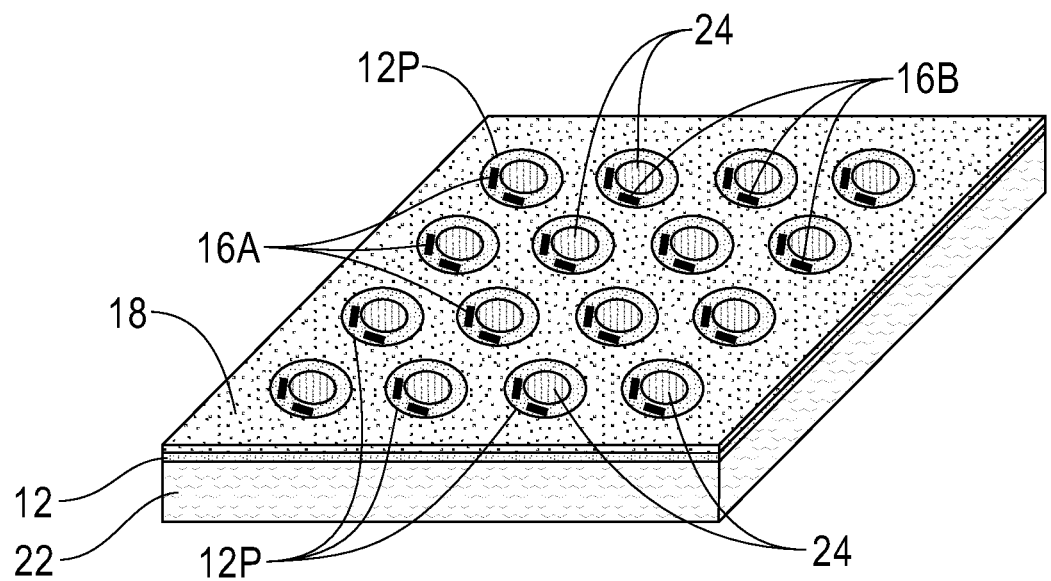
FIG. 10 is a pictorial representation of the exemplary structure of FIG. 9 after performing a second laser cut to provide individual pre-electro-optical module assemblies in accordance with one embodiment of the present application.

Referring now to FIG. 10, there is illustrated the exemplary structure of FIG. 9 after performing a second laser cut to provide individual pre-electro-optical module assemblies in accordance with one embodiment of the present application. The term "pre-electro-optical module assemblies" denotes incomplete, i.e., unfinished, electro-optical module assemblies which lack one or more components. In the illustrated example of FIG. 10, each resultant pre-electro-optical module assemblies lacks a micro-energy source, but includes a remaining portion of the flexible substrate 12P, an electronic component (i.e., first and second electronic components 16A, 16B) and an optical component 24. The optical component 24 and the electronic component (16A, 16B) are located on opposite surfaces of the remaining portion of the flexible substrate 12P. In some embodiments, each remaining portion of the flexible substrate 12P is ring-shaped. In such an embodiment, the ring-shaped has an outer wall having an outer diameter and an inner wall having an inner diameter, wherein the inner diameter is less than the outer diameter, and the inner diameter is defined by a dimension of the opening 17 and the outer diameter is defined the dimension of the opening 20 formed in the frame 18.

Laser cutting may be performed utilizing any laser cutting apparatus that is well known to those skilled in the art. The laser cutting is performed around the edges of each opening 20 formed in the frame 18. This step of the present application provides the outer diameter/perimeter of each electro-optical module assembly to be subsequently formed. In one embodiment, this laser cutting step results in a circular pre-electro-optical module assembly.

Figure 11:
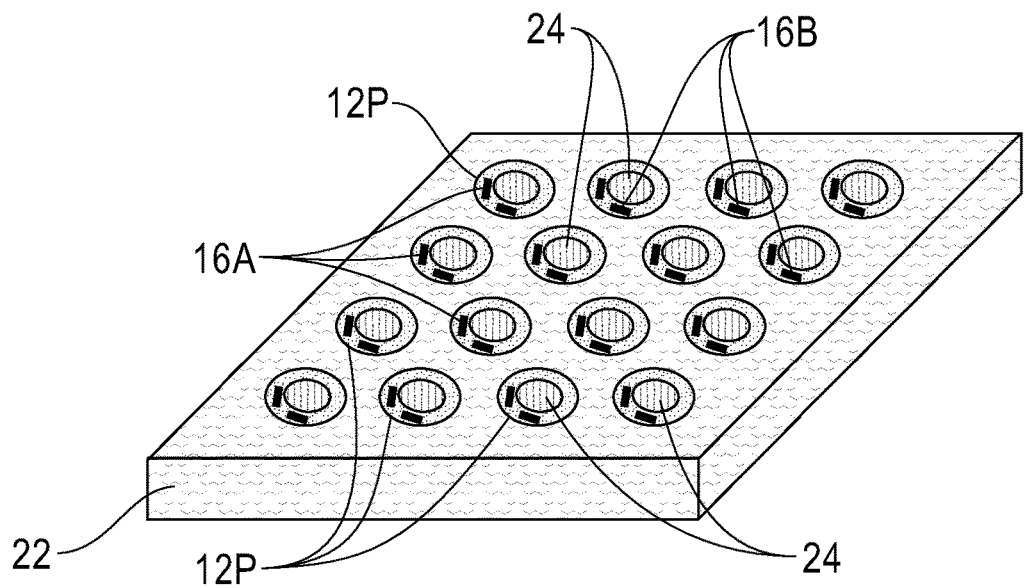
FIG. 11 is a pictorial representation of the exemplary structure of FIG. 10 after removing the frame.

Referring now to FIG. 11, there is illustrated the exemplary structure of FIG. 10 after removing the frame 18 and remaining portions of the flexible substrate 12 that are not used in providing each pre-electro-optical module assembly. The frame 18 and the remaining portions of the flexible substrate 12 that are not used in providing each pre-electro-optical module assembly may be removed by hand or by mechanical means such as a robot arm. Each pre-electro-optical module assembly (12P/16A/16B/24) remains on a surface of the optical component holder 22. A vacuum may or may not be maintained to the optical component holder 22 throughout the removal of the frame 18 and the remaining portions of the flexible substrate 12 that are not used in providing each pre-electro-optical module assembly.

Figure 12:
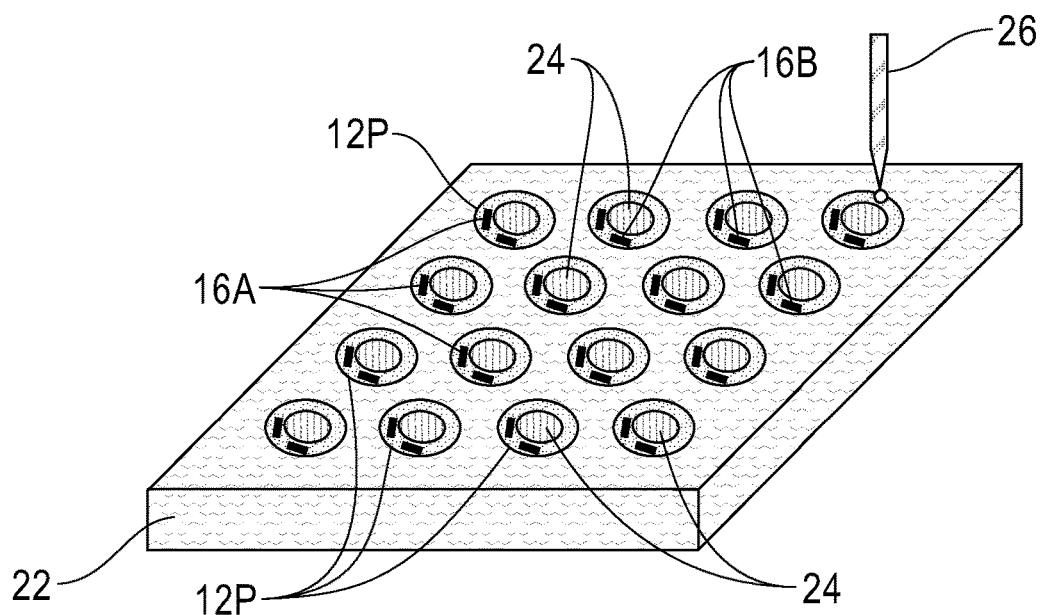
FIG. 12 is a pictorial representation of the exemplary structure of FIG. 11 during adhesive dispensing.

Referring now to FIG. 12, there is illustrated the exemplary structure of FIG. 11 during adhesive dispensing 26.

The adhesive, which may be conductive or non-conductive, is applied to a portion of the first surface of each remaining portion of the flexible substrate 12P that is used in providing each pre-electro-optical module assembly utilizing techniques well known to those skilled in the art. A vacuum may or may not be maintained to the optical component holder 22 throughout this step of present application.

Figure 13:
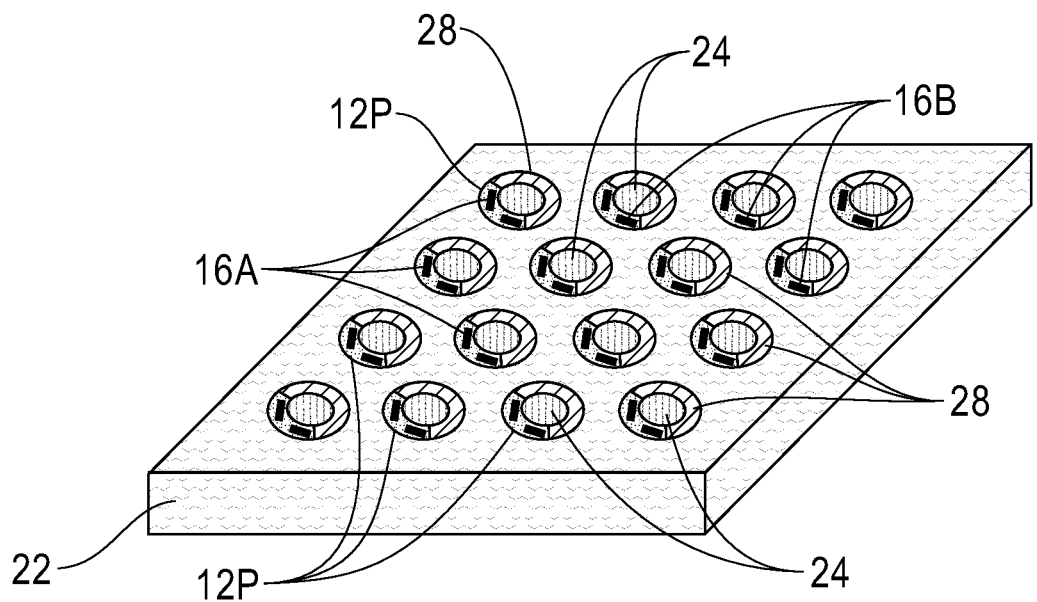
FIG. 13 is a pictorial representation of the exemplary structure of FIG. 12 after affixing a micro-energy source to the adhesive applied to each pre-electro-optical module assembly.

Referring now to FIG. 13, there is illustrated the exemplary structure of FIG. 12 after affixing a micro-energy source 28 to the adhesive applied to each pre-electro-optical module assembly; although a single micro-energy source is described and illustrated, a plurality can be formed in each electro-optical module assembly area. The affixing includes picking a micro-energy source 28, placing the micro-energy source 28 on the adhesive applied to the each pre-electro-optical module assembly provided in FIG. 12, and curing to form a permanent bond. By "micro-energy source" it is meant any energy source whose dimension is less than 1,000 microns. Examples of energy sources that can be employed as the micro-energy source 28 include, but are not limited to, capacitors and micro-batteries. Each micro-energy source 28 can be formed utilizing techniques well known to those skilled in the art. A vacuum may or may not be maintained to the optical component holder 22 throughout this step of present application. After affixing, the vacuum applied to the optical component holder 22 may be turned off, and each electro-optical module assembly can be removed from the surface of the optical component holder 22.

Each electro-optical module assembly (see, FIG. 19) includes a flexible substrate 12P having a first surface 14A and a second surface 14B opposite the first surface 14A. The flexible substrate 12P contains an opening 17 located therein that extends from the first surface 14A to the second surface 14B. The electro-optical module assembly further includes an optical component 24 located on the second surface 14B of the flexible substrate 12P and positioned to have a surface exposed by the opening 17, at least one electronic component (16A, 16B) located on a first portion of the first surface 14A of the flexible substrate 12P, and at least one micro-energy source 28 located on a second portion of the first surface 14B of the flexible substrate 12P.

Figure 14:
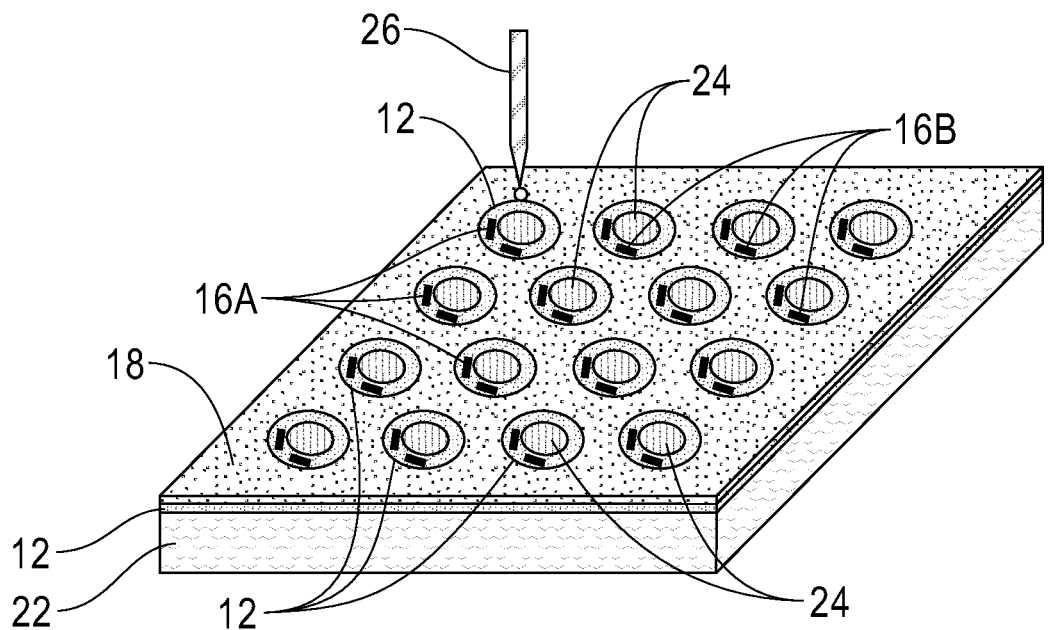
FIG. 14 is a pictorial representation of the exemplary structure of FIG. 9 during adhesive dispensing in accordance with another embodiment of the present application.

Referring now to FIG. 14, there is illustrated the exemplary structure of FIG. 9 during adhesive dispensing 26 in accordance with another embodiment of the present application. In this embodiment, the adhesive dispensing 26 is performed prior to performing the second laser cutting process. The adhesive, which may be conductive or non-conductive, is applied to a portion of the first surface of each flexible substrate 12 that present in each electro-optical module assembly area utilizing techniques well known to those skilled in the art. A vacuum may or may not be maintained to the optical component holder 22 throughout this step of present application.

Figure 15:
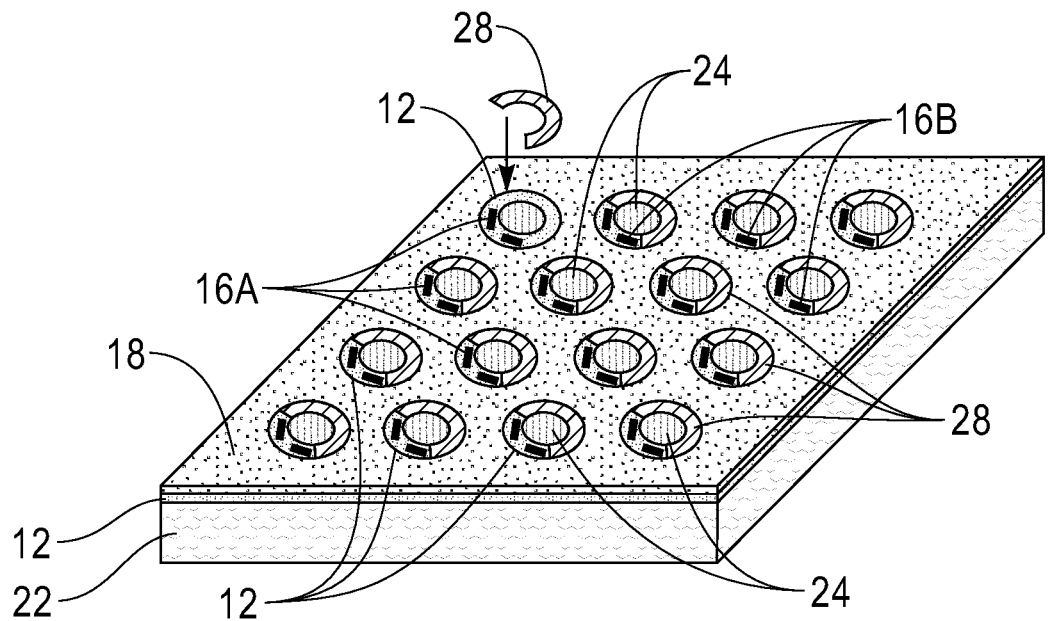
FIG. 15 is a pictorial representation of the exemplary structure of FIG. 14 after affixing a micro-energy source to the adhesive.

Referring now to FIG. 15, there is a pictorial representation of the exemplary structure of FIG. 14 after affixing a micro-energy source 28 (as defined above) to the adhesive; although a single micro-energy source is described and illustrated, a plurality can be formed in each electro-optical module assembly area. The affixing includes picking a micro-energy source 28, placing the micro-energy source 28 on the adhesive applied to the each electro-optical module assembly area, and curing to form a permanent bond. A vacuum may or may not be maintained to the optical component holder 22 throughout this step of present application.

Figure 16:
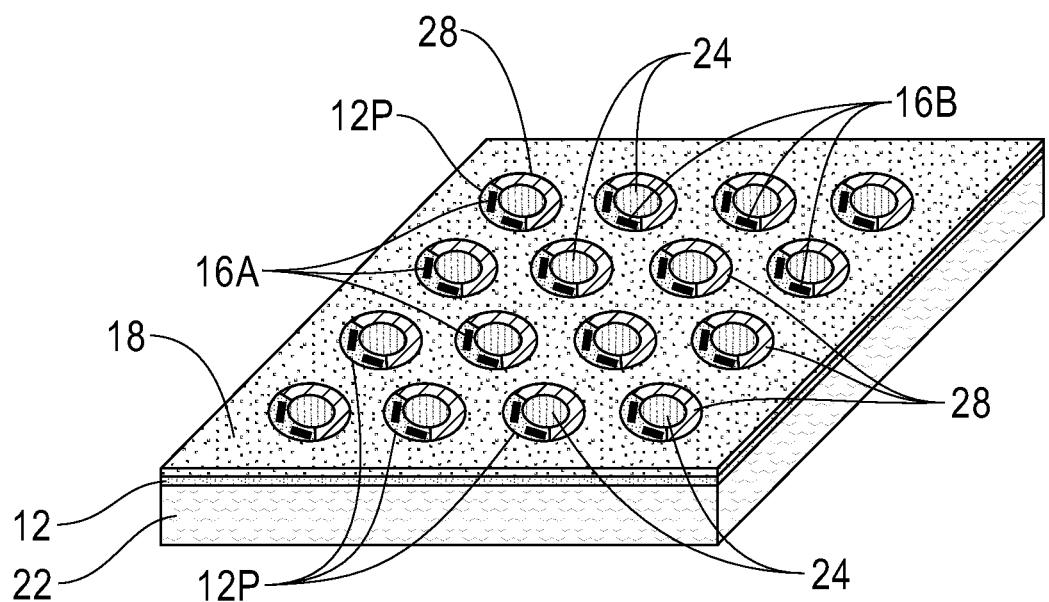
FIG. 16 is a pictorial representation of the exemplary structure shown in FIG. 15 after performing a second laser cut to provide individual electro-optical module assemblies in accordance with one embodiment of the present application.

Referring now to FIG. 16, there is illustrated the exemplary structure shown in FIG. 15 after performing a second laser cut to provide individual electro-optical module assemblies in accordance with one embodiment of the present application. Laser cutting may be performed utilizing any laser cutting apparatus that is well known to those skilled in the art. The laser cutting is performed around the edges of each opening 20 formed in the frame 18. This step of the present application provides the outer diameter/perimeter of each electro-optical module assembly. In one embodiment, this laser cutting step results in a circular electro-optical module assembly. In some embodiments, each remaining portion of the flexible substrate 12P that is provided by the second laser cutting process is ring-shaped. In such an embodiment, the ring-shaped has an outer wall having an outer diameter and an inner wall having an inner diameter, wherein the inner diameter is less than the outer diameter, and the inner diameter is defined by a dimension of the opening 17 and the outer diameter is defined the dimension of the opening 20 formed in the frame 18.

Each electro-optical module assembly (see, FIG. 18) includes a flexible substrate 12P having a first surface 14A and a second surface 14B opposite the first surface 14A. The flexible substrate 12P contains an opening 17 located therein that extends from the first surface 14A to the second surface 14B. The electro-optical module assembly further includes an optical component 24 located on the second surface 14B of the flexible substrate 12P and positioned to have a surface exposed by the opening 17, at least one electronic component (16A, 16B) located on a first portion of the first surface 14A of the flexible substrate 12P, and at least one micro-energy source 28 located on a second portion of the first surface 14B of the flexible substrate 12P.

Figure 17:
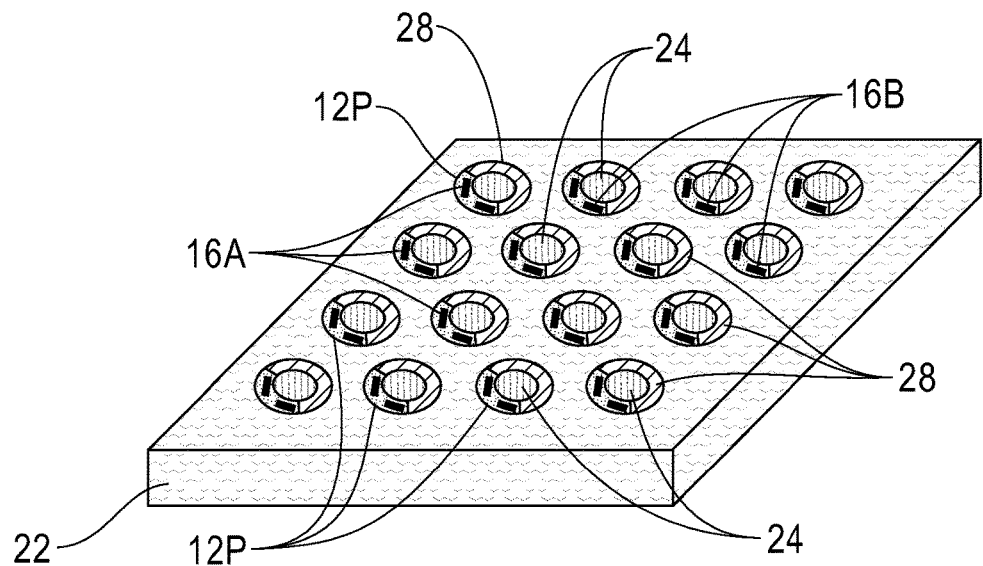
FIG. 17 is a pictorial representation of the exemplary structure shown in FIG. 16 after removing the frame.

Referring now to FIG. 17, there is illustrated the exemplary structure shown in FIG. 16 after removing the frame 18 and remaining portions of the flexible substrate 12 that are not used in providing each electro-optical module assembly. The frame 18 and the remaining portions of the flexible substrate 12 that are not used in providing each electro-optical module assembly may be removed by hand or by mechanical means such as a robot arm. Each electro-optical module assembly (12P/16A/16B/24/28) remains on a surface of the optical component holder 22. A vacuum may or may not be maintained to the optical component holder 22 throughout the removal of the frame 18 and the remaining portions of the flexible substrate 12 that are not used in providing each electro-optical module assembly. The vacuum may be turned off after the second laser cutting step.

Figure 18:
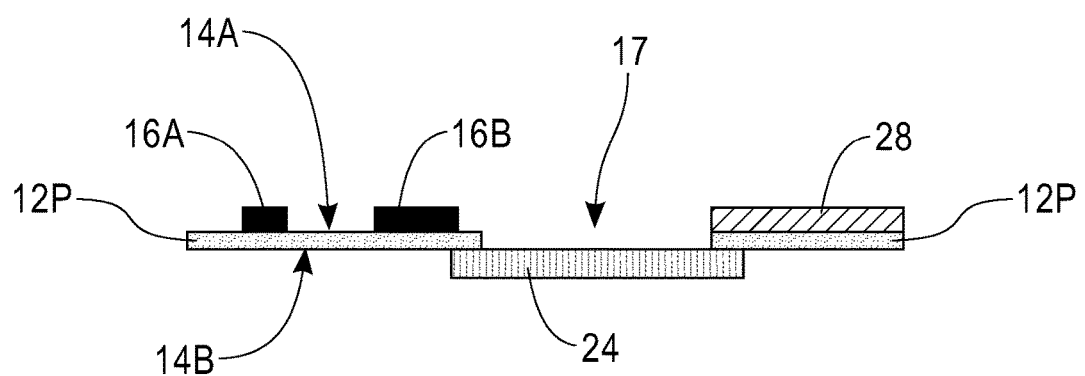
FIG. 18 is a pictorial representation of one of the electro-optical module assemblies of the present application.

Referring now to FIG. 18, there is an enlarged cross sectional view of one of the electro-optical module assemblies of the present application as provided utilizing the various methods of the present application. The electro-optical module assembly includes a flexible substrate 12P having a first surface 14A and a second surface 14B opposite the first surface 14A. The flexible substrate 12P contains an opening 17 located therein that extends from the first surface 14A to the second surface 14B. The electro-optical module assembly further includes an optical component 24 located on the second surface 14B of the flexible substrate 12P and positioned to have a surface exposed by the opening 17, at least one electronic component (16A, 16B) located on a first portion of the first surface 14A of the flexible substrate 12P, and at least one micro-energy source 28 located on a second portion of the first surface 14B of the flexible substrate 12P. In accordance with the present application, the optical component 24, the at least one electronic component (16A, 16B) and the at least one micro-energy source 28 are in electrical communication with each other.

Figure 19:
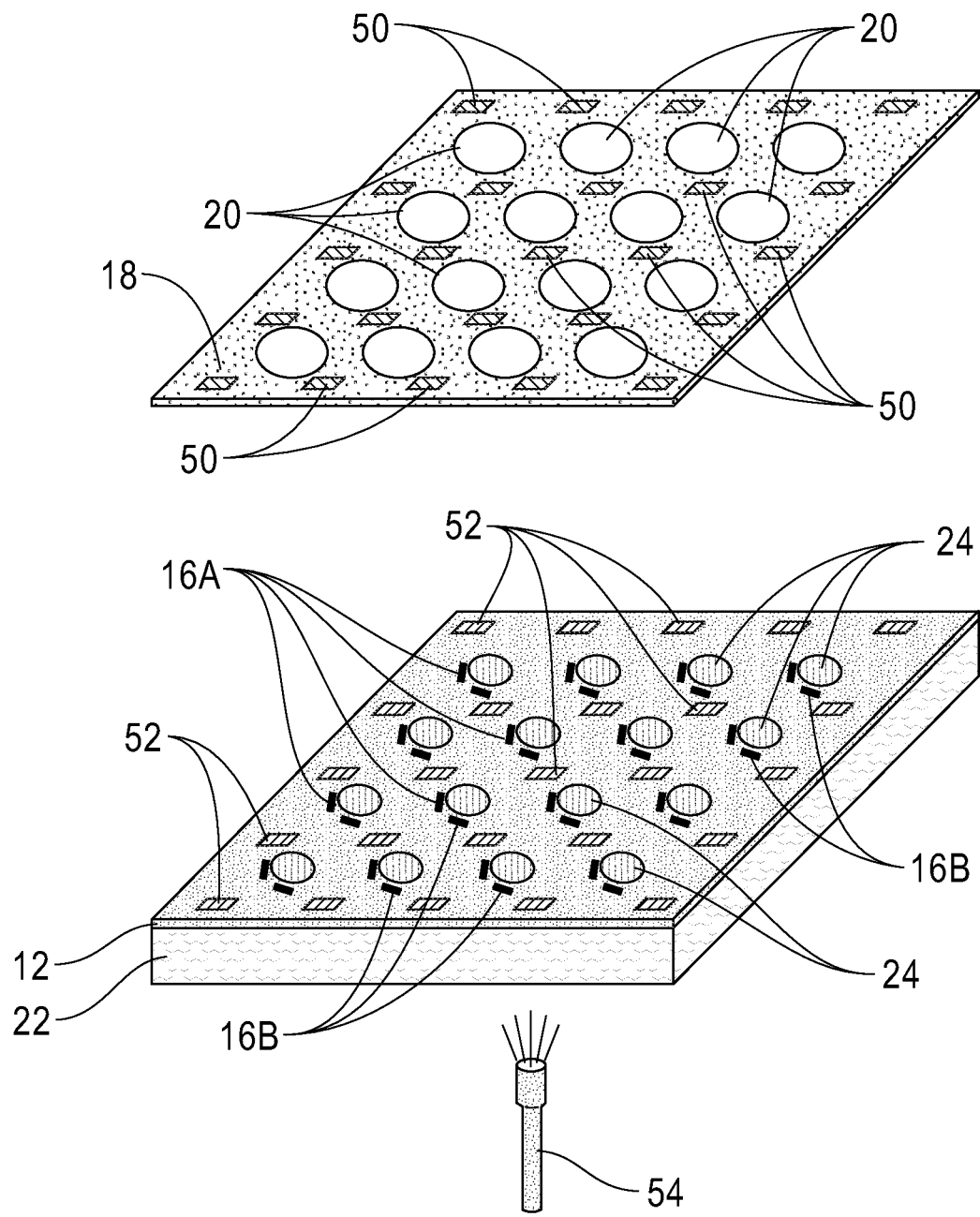
FIG. 19 is a pictorial representation of a frame containing openings and integrated probes located on one surface thereof, and a corresponding flexible substrate that contains a plurality of areas for electro-optical module assembly and integrated traces and pads for electrical testing that can be employed in accordance with yet another embodiment of the present application.

Referring now to FIG. 19, there is illustrated a test structure containing a frame 18 containing openings 20 and integrated probes 50 located on one surface thereof, and a corresponding flexible substrate 12 that contains first and second electronic components (16A, 16B), optical components 24 and integrated traces and pads 52 for electrical testing that can be employed in accordance with yet another embodiment of the present application. The frame 18, flexible substrate 12, first and second electronic components (16A, 16B), and optical components 24 used in this embodiment of the present application are the same as in previous embodiments of the present application. The integrated probes 50 include a conductive metal can be formed utilizing techniques well known those skilled in the art. The integrated traces and pads 52 are composed of conductive metals and can be formed utilizing techniques well known in the art.

The integrated probes 50 of the frame 18 and the integrated traces and pads 52 of the flexible substrate 12 are configured to contact each other upon contacting the frame 18 with the flexible substrate 12. In accordance with the present application, each opening 20 in the frame 18 is configured to expose one of the areas for forming one of the electro-optical module assemblies. The test structure even further includes a light source 54 located beneath the flexible substrate 12. An optical component holder 22 as defined above can be located between the flexible substrate 12 and the light source 54. The text structure shown in FIG. 20 can be used to test each individual electro-optical module assembly that is formed.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A test structure comprising:
    a frame containing a plurality of openings that extend entirely through the frame and having a plurality of integrated probes located on a surface thereof;
    a flexible substrate located entirely beneath the frame and comprising areas for forming electro-optical module assemblies, the flexible substrate containing integrated traces and pads for electrical testing located on a surface thereof, wherein the integrated probes and the integrated traces and pads are configured to contact each other upon contacting the frame with the flexible substrate, and wherein each opening in the frame is configured to physically expose one of the areas for forming one of the electro-optical module assemblies;
    an optical component holder located entirely beneath the flexible substrate, wherein the optical component holder is configured to include a plurality of openings, each opening in the optical component holder containing an optical component to affix to a surface of the flexible substrate opposite a surface that contacts the frame; and
    a light source located entirely beneath, and spaced apart from, the optical component holder.

2. The test structure of claim 1, wherein the surface containing the integrated traces and pads further comprises at least one electronic component located in each of the areas for forming the electro-optical module assemblies.

3. The test structure of claim 1, wherein the integrated probes are composed of a conductive metal.

4. The test structure of claim 1, wherein the integrated traces and pads are composed of a conductive metal.

5. The test structure of claim 1, wherein the flexible substrate is composed of a flexible plastic.

6. The test structure of claim 2, wherein the at least one electronic component comprises a semiconductor die.

7. The test structure of claim 2, wherein the at least one electronic component comprises an RF antenna.

8. The test structure of claim 1, wherein the optical components comprise a mirror.

9. The test structure of claim 1, wherein the optical components comprise a lens including a camera.

10. The test structure of claim 1, wherein the optical components comprise a contact lens.

11. The test structure of claim 1, wherein the optical components comprise a prism.

12. The test structure of claim 1, wherein the optical components comprise an optical filter.

13. The test structure of claim 1, wherein the optical components comprise a light emitting diode.

14. The test structure of claim 1, wherein the openings present in the frame are circular openings.

15. The test structure of claim 1, wherein the frame is a metallic frame.

* * * * *